United States Patent
Cathey et al.

[11] Patent Number: 6,074,926
[45] Date of Patent: *Jun. 13, 2000

[54] METHOD OF INCREASING CAPACITANCE BY SURFACE ROUGHENING IN SEMICONDUCTOR WAFER PROCESSING

[75] Inventors: David A. Cathey; Mark E. Tuttle; Tyler A. Lowrey, all of Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/813,913

[22] Filed: Mar. 7, 1997

Related U.S. Application Data

[63] Continuation of application No. 08/459,491, Jun. 2, 1995, abandoned, which is a continuation of application No. 08/121,333, Sep. 13, 1993, abandoned, which is a continuation of application No. 07/812,061, Feb. 17, 1991, Pat. No. 5,244,842.

[51] Int. Cl.[7] .................................................. H01L 21/70
[52] U.S. Cl. .......................................... 438/398; 438/386
[58] Field of Search ..................................... 437/977, 919, 437/228, 233, 52, 60; 148/DIG. 138, DIG. 14; 156/643, 644, 646, 657

[56] References Cited

U.S. PATENT DOCUMENTS

| | | | |
|---|---|---|---|
| 4,407,695 | 10/1983 | Deckman et al. | 216/42 |
| 4,806,202 | 2/1989 | Tang et al. | 438/695 |
| 5,017,505 | 5/1991 | Fujii et al. | 438/594 |
| 5,037,773 | 8/1991 | Lee et al. | 438/255 |
| 5,068,199 | 11/1991 | Sandhu | 438/255 |
| 5,082,797 | 1/1992 | Chan et al. | 438/255 |
| 5,102,832 | 4/1992 | Tuttle | 438/398 |
| 5,112,773 | 5/1992 | Tuttle | 438/398 |
| 5,134,086 | 7/1992 | Ahn | 438/398 |
| 5,149,676 | 9/1992 | Kim et al. | 438/398 |
| 5,182,232 | 1/1993 | Chhabra et al. | 438/398 |
| 5,213,992 | 5/1993 | Lu | 438/977 |
| 5,234,858 | 8/1993 | Fazan et al. | 438/253 |
| 5,236,855 | 8/1993 | Dennison et al. | 438/397 |
| 5,240,871 | 8/1993 | Doan et al. | 438/397 |
| 5,244,842 | 9/1993 | Catney et al. | 438/398 |
| 5,266,512 | 11/1993 | Kirsch | 438/253 |
| 5,275,693 | 1/1994 | Nakama | 216/75 |
| 5,290,729 | 3/1994 | Hayshide et al. | 937/977 |
| 5,366,917 | 11/1994 | Watanabe et al. | 438/398 |

FOREIGN PATENT DOCUMENTS

| | | |
|---|---|---|
| 59-123279 | 7/1984 | Japan . |
| 1-187847 | 7/1989 | Japan . |

OTHER PUBLICATIONS

Wolf, vol. 1, Silicon Processing for the ULSI Era process technology, pp. 162–164, and 183–185 copyright©1986 by Lattice press.

*Primary Examiner*—Savitri Mulpuri
*Attorney, Agent, or Firm*—Wells, St. John, Roberts, Gregory & Matkin, P.S.

[57] ABSTRACT

A method of increasing capacitance by surface roughening in semiconductor wafer processing includes the following steps: a) applying a first layer of material atop a substrate thereby defining an exposed surface; b) incontinuously adhering discrete solid particles to the first layer exposed surface to roughen the exposed surface; and c) applying a second layer of material atop the first layer and adhered solid particles to define an outer surface, the particles adhered to the first layer inducing roughness into the outer surface thereby increasing its surface area and accordingly capacitance of the second layer in the final wafer structure.

2 Claims, 3 Drawing Sheets

6,074,926

METHOD OF INCREASING CAPACITANCE BY SURFACE ROUGHENING IN SEMICONDUCTOR WAFER PROCESSING

RELATED PATENT DATA

This patent resulted from a file wrapper continuation application of U.S. patent application Ser. No. 08/459,491, filed on Jun. 2, 1995 now abandoned, entitled "Method Of Increasing Capacitance By Surface Roughening In Semiconductor Wafer Processing, listing the inventors as David A. Cathey, Mark E. Tuttle and Tyler A. Lowrey, which is a file wrapper continuation application of U.S. patent application Ser. No. 08/121,333, filed on Sep. 13, 1993, now abandoned, which is a continuation application of U.S. patent application Ser. No. 07/812,061, Feb. 17, 1991 which issued as U.S. Pat. No. 5,244,842, which has reissued as U.S. Pat. No. RE 35,420.

TECHNICAL FIELD

This invention relates generally to roughening a surface to maximize its surface area, and thereby increase available capacitance.

BACKGROUND OF THE INVENTION

As device dimensions continue to shrink in semiconductor processing, such as in the increased density of DRAMs, there is a continuing challenge to maintain desired high storage capacitance despite decreasing device size. A principal way of increasing device density is through construction techniques which include three dimensional capacitors such as trenched or stacked capacitors. It is as well recognized that capacitance can be increased by surface roughening of capacitor plates.

This invention comprises an improved technique for roughening a surface to maximize its surface area thereby increasing the capacitance which is available.

BRIEF DESCRIPTION OF THE DRAWINGS

Peferred embodiments of the invention are described below with reference to the accompanying drawings.

DETAILED DESCRIPTION OF PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of increasing capacitance by surface roughening in semiconductor wafer processing comprises:

applying a first layer of material atop a substrate thereby defining an exposed surface;

incontinuously adhering discrete solid particles to the first layer exposed surface to roughen the exposed surface; and applying a second layer of material atop the first layer and adhered solid particles to define an outer surface, the particles adhered to the first layer inducing roughness into the outer surface thereby increasing its surface area and accordingly capacitance of the second layer.

In accordance with another aspect of the invention, a method of forming a capacitor in semiconductor wafer processing comprises:

providing a layer of insulating dielectric atop a partially processed semiconductor wafer;

etching a contact opening in the dielectric layer which aligns with an active area beneath the dielectric layer;

applying a first layer of polysilicon to a thickness of from about 300 to about 2,000 Angstroms atop the etched dielectric layer thereby defining an exposed surface of polysilicon, the polysilicon making contact with the active area;

incontinuously adhering discrete solid particles to the polysilicon exposed surface to roughen the exposed surface;

applying a second layer of polysilicon to a thickness of from about 300 Angstroms to about 2,000 Angstroms atop the first polysilicon layer and adhered solid particles to provide a lower capacitor plate having an outer surface, the particles adhered to the first polysilicon layer inducing roughness into the outer surface thereby increasing its surface area and the resultant capacitance;

applying a layer of capacitor dielectric atop the outer surface, the roughness of the outer surface at least in part being transferred to the capacitor dielectric layer; and applying a third layer of polysilicon atop the capacitor dielectric layer, the roughness of the capacitor dielectric layer at least in part being transferred to the third layer of polysilicon.

In accordance with yet another aspect of the invention, a method of increasing capacitance by surface roughening in semiconductor wafer processing comprises the following steps:

applying a first layer of material atop a substrate thereby defining an exposed surface;

incontinuously adhering discrete solid particles to the first layer exposed surface;

etching the first layer having adhered particles with an etch chemistry that etches the first layer material but is selective to the particles to etch into and roughen exposed first layer area not covered by particles.

Figure 1:
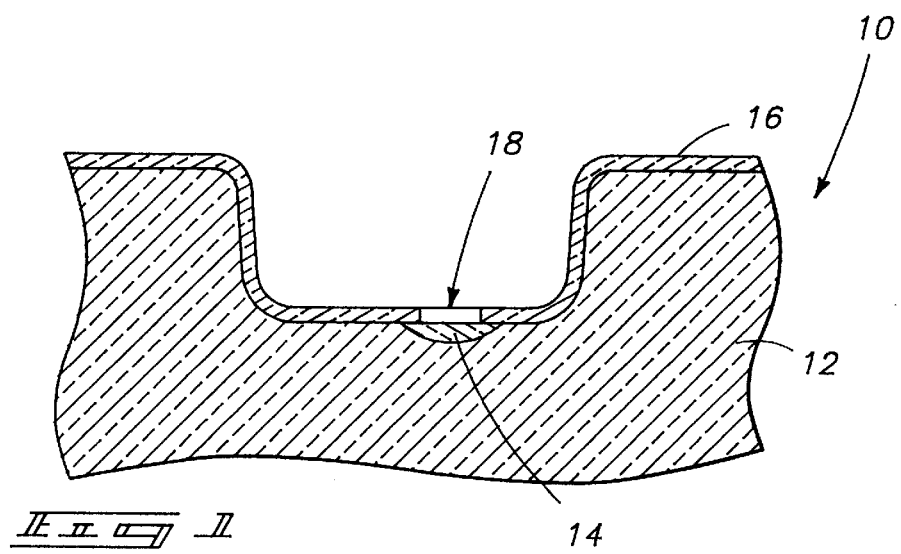
FIG. 1 is a diagrammatic sectional view of a wafer fragment at a processing step in accordance with the invention.

FIG. 1 depicts a semiconductor wafer or substrate 10. The discussion proceeds with methods of increasing capacitance between layers and formation of a capacitor with respect to wafer 10. Such includes a bulk substrate region 12 having an active area or electrical node 14 formed therein. An insulating dielectric layer 16 has been applied atop bulk substrate 12, and a contact opening 18 etched therein to provide an access opening to active area 14. A capacitor structure will be generated atop dielectric layer 16, with a lower capacitor plate making contact through opening 18 to active area 14.

Figure 2:
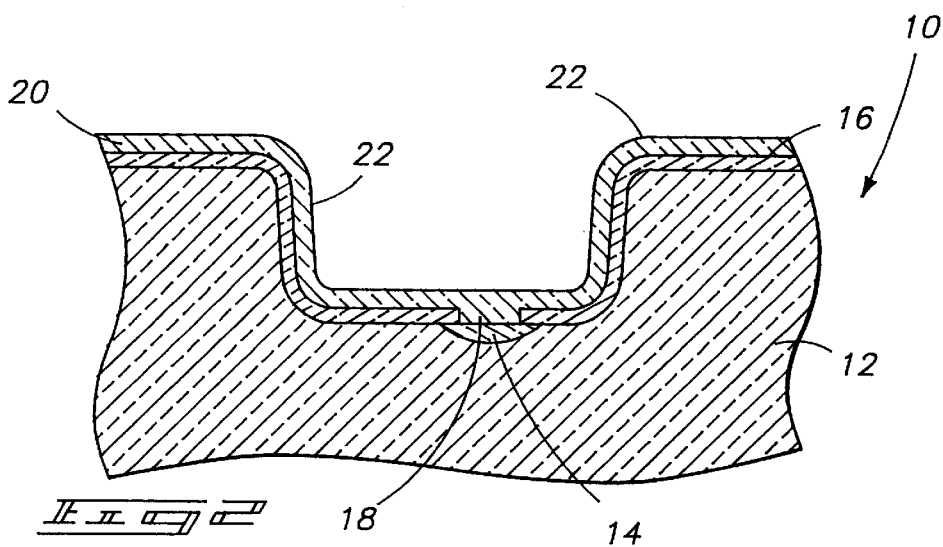
FIG. 2 is a diagrammatic sectional view of the FIG. 1 wafer illustrated at a processing step subsequent to that illustrated by FIG. 1.

Referring to FIG. 2, a first layer of material 20 is applied atop etched dielectric layer 16 thereby defining an upper exposed surface 22. Preferably, first layer of material 20 is polysilicon applied to a thickness of from about 300 Angstroms to 2,000 Angstroms, with 1,000 Angstroms being typical. Polysilicon layer 20 makes contact with active area 14 through contact opening 18.

Figure 3:
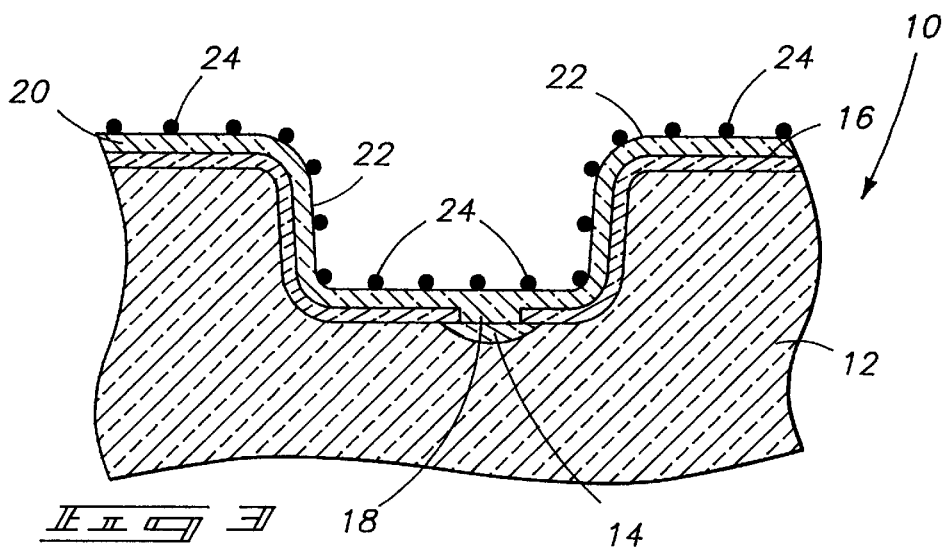
FIG. 3 is a diagrammatic sectional view of the FIG. 1 wafer illustrated at a processing step subsequent to that illustrated by FIG. 2.

Referring to FIG. 3, discrete solid particles 24 are incontinuously adhered to first layer 20 exposed surface 22, which effectively produces irregularities in upwardly exposed surface 22 thereby rendering it rougher than it was before particles 24 were applied. Particles 24 thereby become a part of exposed surface 22. Particles 24 are applied in such a manner that they do not provide a continuous layer of material atop first poly layer 20, but rather result in an incontinuous application which produces discrete solid particles (either isolated or in groups) to induce a roughened effect onto exposed surface 22. Particles 24 preferably have an average diameter ranging from about 30 Angstroms to about 3,000 Angstroms, with 90 Angstroms being typical. The particle material should be selected or provided in such that particles 24 physically adhere to first layer 20. By way of example only, such particle material includes $SiO_2$ and $Al_2O_3$.

The preferred method of application comprises a slurry dip. Substrate 10 is dipped into a slurry of a solution containing the suspended solid particles. The time period within which the wafer is in contact with the slurry is not expected to be very long. Expected residence times are from five seconds to five minutes. The substrate is removed from the slurry with the discrete solid particles 24 adhering to layer 20. Remaining solution of the wafer after removal would be rinsed from the wafer, leaving particles 24 adhering thereto. Where oxide may have formed atop polysilicon layer 20 prior to particle application, preferably such oxide is removed by an HF dip or other method as will be recognized by those people with skill in the art.

The invention was reduced to practice using a standard colloidal silica slurry used in chemical mechanical polishing techniques (CMP). The particular slurry used was 6 parts water, 1 part Cab-o-Sperse™ colloidal silicon, Grade SC-1 by Rippey Corp., 5080 Robert J. Mathews Parkway, Elderado Hills, Calif. Such is supplied to end-users at a pH of 10 to 12, and includes suspended glass $SiO_2$ having an average or typical diameter of about 90 Angstroms. A dip in such slurry of less than five seconds adhered the $SiO_2$ particles of the slurry to the polysilicon surface. Upon removal of the wafer, it was rinsed and dried with particles 24 still adhering to the wafer surface. The adherence of the $SiO_2$ particles is understood to result from chemical interaction with the surface due to van der Waals forces and dangling or available silicon bonding sites at the edge of the polycrystalline silicon structure that adhere to the $SiO_2$. Materials other than polysilicon and $SiO_2$ particles could of course be utilized in the context of the invention.

Figure 4:
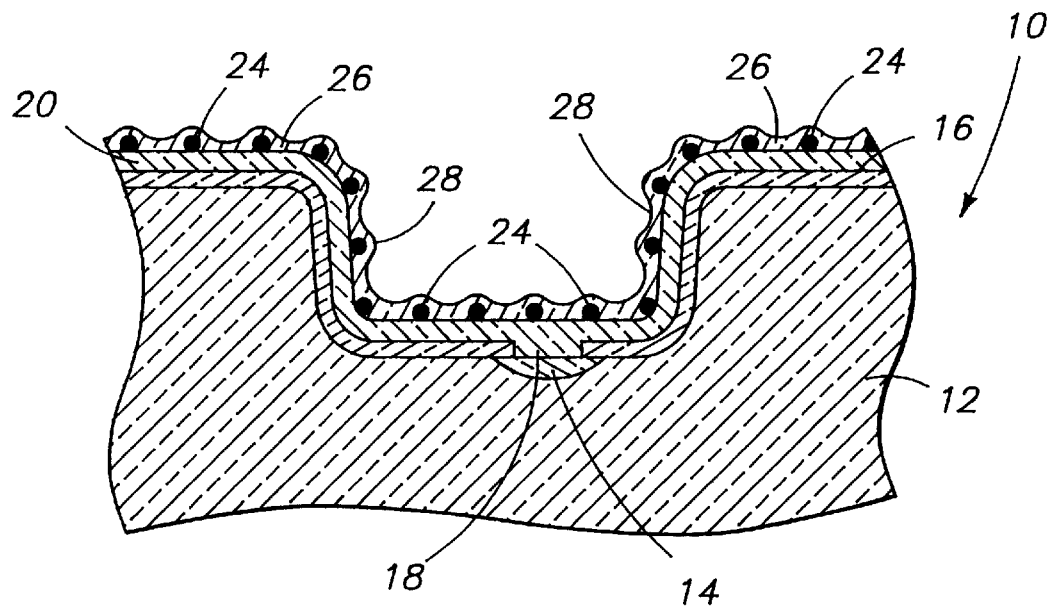
FIG. 4 is a diagrammatic sectional view of the FIG. 1 wafer illustrated at a processing step subsequent to that illustrated by FIG. 3.

Referring to FIG. 4, a second layer 26 of polysilicon or other material is applied atop first layer 20 and adhered solid particles 24 thereby defining an outer surface 28. Second layer 26 is preferably applied to a thickness of from about 100 Angstroms to about 2,000 Angstroms, with 500 Angstroms being typical. Particles 24 adhering to first layer 20 induce roughness into outer surface 28 thereby increasing the surface area of outer surface 28 than were particles 24 not present, and accordingly increasing the capacitance of the final structure. In the described embodiment, the composite or combination of layers 20 and 26 which include particles 24 will become a lower capacitor plate.

Figure 5:
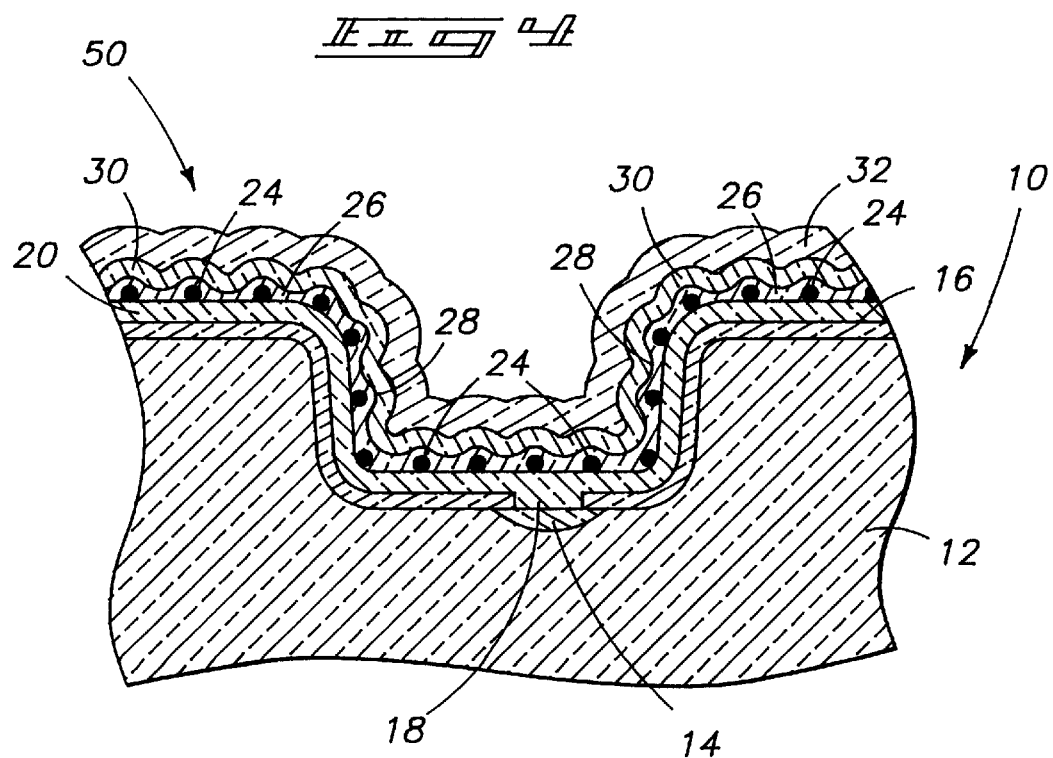
FIG. 5 is a diagrammatic sectional view of the FIG. 1 wafer illustrated at a processing step subsequent to that illustrated by FIG. 4.

Referring to FIG. 5, a capacitor dielectric layer 30, such as 100 Angstroms $Si_3N_4$ and 20 Angstroms $SiO_2$; 100 Angstroms $SiO_2$ and 20 Angstroms $Ta_2O_5$; 100 Angstroms $Si_3N_4$ and 20 Angstroms $Ta_2O_5$; $Ta_2O_5$ or $SiO_2$ or $Si_3N_4$, is applied atop outer surface 28. The roughness of outer surface 28 transfers at least in part to the capacitor dielectric layer roughening its upper surface. Thereafter, a third layer 32 of polysilicon or other material is applied atop capacitor dielectric layer 30, with the roughness of capacitor dielectric layer 30 at least in part being transferred to third layer 32. This thereby defines a capacitor structure 50. The significant area for roughening and capacitance increase occurs at the interfaces of layers 32 and 26 with the capacitor dielectric 30.

Layers 20 and 26 could be separately patterned to define an outline of a lower capacitor plate either individually or at the conclusion of application of layer 26. Alternatively, but less preferred, patterning might not be conducted until after formation of the construction illustrated by FIG. 5. Further, layers 20 and 26 could be conductively doped in situ during their respective applications, or subsequent to their application. Additionally, poly layer 20 could be patterned before or after slurry treatment. Alternate slurries, such as an aluminum oxide or silicon slurry, could of course also be used.

Figure 6:
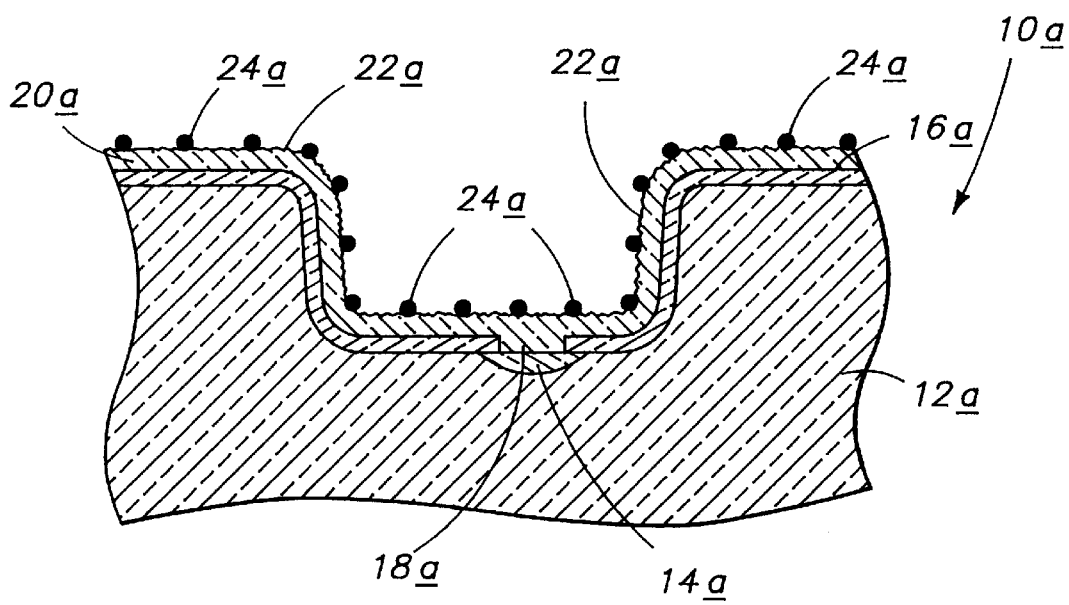
FIG. 6 is a diagrammatic sectional view of an alternate wafer depicting an alternate processing step in accordance with the invention.

Additional methods in the context of the invention could also be used to further roughen the surface area and thereby increase capacitance. One of such methods concerns the slurry step of application of particles 24. The slurry solution could be selected or comprise a chemistry that chemically etches the exposed first layer material 20 during the slurry dip process. With respect to polysilicon, it is anticipated that the CMP colloidal silicon slurry at a pH of between 11 and 14, with 12 being preferred, could be utilized to further roughen poly layer 20 during the particle adhering step without appreciably removing layer 20 from the substrate. By increasing, monitoring and controlling the residence time during the dip as would be readily determined by a person of skill in the art, the outer surface of poly 20 would be roughened as diagrammatically illustrated by FIG. 6. (Like components between the various embodiments of the disclosure utilize the same numbers, with the suffixes "a" and "b" being utilized to designate the different alternate embodiments.) In FIG. 6, wafer 10a is illustrated as having a poly layer 20a and particles 24a applied thereto. Upper surface 22a is illustrated as being roughened more than the FIGS. 1–5 embodiment due to etching of layer 20a during the slurry dip process. Such additional roughening of surface 22a will transfer at least in part to the subsequent dielectric layer and upper capacitor plate layer (not shown), thereby increasing available capacitance further.

Figure 7:
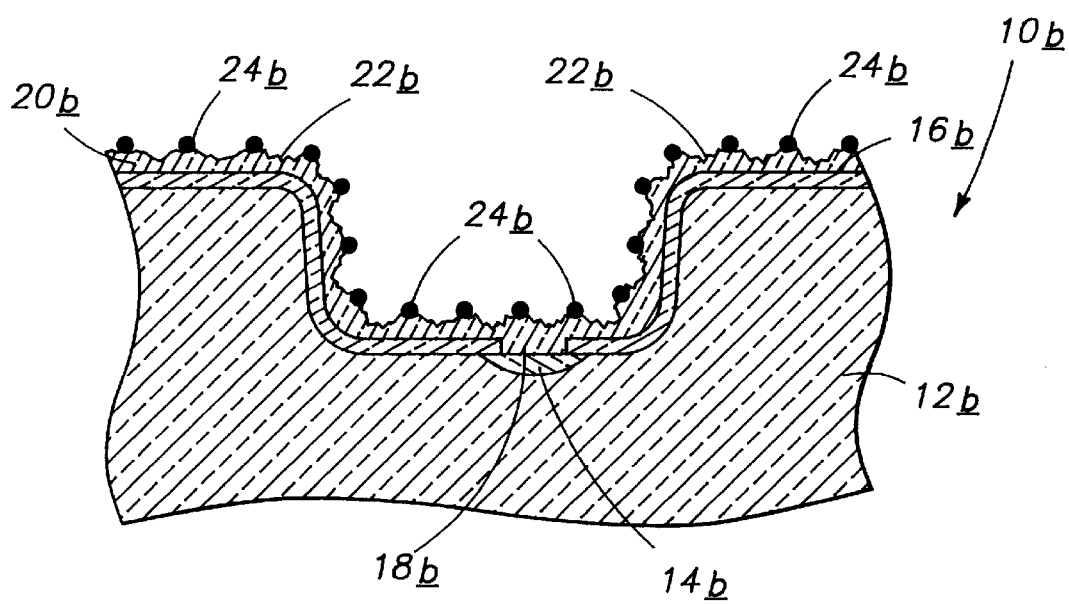
FIG. 7 is a diagrammatic sectional view of a wafer fragment illustrating still another alternate processing step in accordance with the invention.

In an alternate method of added roughening, the method would further comprise etching first layer 20 having particles 24 adhered thereto with an etch chemistry that etches first layer material but is selective to the material of particles 24. This will thereby further roughen exposed first layer area 22 not covered by particles 24. Such is diagrammatically illustrated in FIG. 7. The upper surface area 22b between particles 24b is indicated as being etched to further increase the roughness of applied layer 20b. The degree of etching is illustrated as being greater in degree or severity than that illustrated by the FIG. 6 method, thereby further increasing available capacitance. An example etch chemistry and method which would etch the polysilicon and not the $SiO_2$ particles of the example would include chlorine containing plasma, a high pH aqueous solution such as KOH or ammonium hydroxide, or a mixture containing nitric acid, acetic acid, water and hydrofluoric acid. The methods depicted by FIGS. 6 and 7 could be combined, thereby further enhancing surface roughening.

In yet another aspect of the invention the wafer could be processed as generally described above, except that particles 24a or 24b are removed prior to deposition of the dielectric layer. With respect to the example of FIG. 6, a slurry solution containing particles 24a which will etch material 20a will roughen surface 22a to a greater degree than were particles 24a not in the slurry solution. Upon adhering of particles 24a to material 20a, the slurry will continue to etch exposed material 20a which is not covered by adhered particles 24a. Such will produce higher peaks and lower valleys than were the particles not present in the slurry. With respect to the example of FIG. 7, a subsequent etch (after particle 24a adherence) which is selective to the particles will likewise produce higher peaks and lower valleys than were the particles not adhered to material 20a during the etch. The particles 24a or 24b could then be removed leaving a rougher surface than would otherwise have been obtained were the particles not present earlier in the process. Where the particles are $SiO_2$ or $Al_2O_3$, an HF dip would be an example of a method which would remove the particles without disrupting first layer material 20, 20a, or 20b. Thereafter, a capacitor dielectric layer would be applied, followed by the other capacitor plate material.

In compliance with the statute, the invention has been described in language more or less specific as to structural and methodical features. It is to be understood, however, that the invention is not limited to the specific features shown and described, since the means and construction herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor, comprising:
   providing a substrate having a trench formed therein, the substrate defining a periphery of the trench;
   providing an electrical node within the substrate and at the periphery of the trench;
   forming a layer of polysilicon over the substrate and within the trench, the layer of polysilicon being in electrical connection with the electrical node;
   incontinuously adhering discrete solid particles to the layer of polysilicon, such particles comprising one or both of $SiO_2$ and $Al_2O_3$;
   etching the layer of polysilicon having the adhered discrete solid particles with an etch chemistry that etches the layer of polysilicon but is selective to the adhered discrete solid particles to etch into the polysilicon not covered by the adhered discrete solid particles;
   forming a capacitor dielectric layer over the etched layer of polysilicon and within the trench; and
   forming a capacitor plate layer over the capacitor dielectric layer and within the trench.

2. A method of forming a capacitor, comprising:
   providing a substrate having a trench formed therein;
   forming an insulative material over the substrate and within the trench;
   forming an opening extending through a portion of the insulative material within the trench;
   providing an electrical node in the substrate and exposed through the opening in the insulative material;
   forming a layer of polysilicon over the insulative material and within the trench, the layer of polysilicon extending through the opening in the insulative material and physically contacting the electrical node;
   incontinuously adhering discrete solid particles to the layer of polysilicon, such particles comprising one or both of $SiO_2$ and $Al_2O_3$;
   etching the layer of polysilicon having the adhered discrete solid particles with an etch chemistry that etches the layer of polysilicon but is selective to the adhered discrete solid particles to etch into the polysilicon not covered by the adhered discrete solid particles;
   forming a capacitor dielectric layer over the etched layer of polysilicon and within the trench; and
   forming a capacitor plate layer over the capacitor dielectric layer and within the trench.

* * * * *

UNITED STATES PATENT AND TRADEMARK OFFICE
CERTIFICATE OF CORRECTION

PATENT NO : 6,074,926
DATED : June 13, 2000
INVENTOR(S) : David A. Cathey et al.

It is certified that error appears in the above-identified patent and that said Letters Patent are hereby corrected as shown below:

Col. 1, line 14
 replace "Feb."
 with --Dec.--.

Col. 2, line 61
 delete "or electrical node".

Signed and Sealed this

Twenty-fourth Day of April, 2001

Attest:

NICHOLAS P. GODICI

Attesting Officer

Acting Director of the United States Patent and Trademark Office